United States Patent [19]
Chen et al.

[11] Patent Number: 5,868,847
[45] Date of Patent: Feb. 9, 1999

[54] CLAMP RING FOR SHIELDING A SUBSTRATE DURING FILM LAYER DEPOSITION

[75] Inventors: Aihua Chen, Fremont; Zheng Xu, Foster City; Howard Grunes, Santa Cruz; Avi Tepman, Cupertino; Igor Kogan, San Francisco, all of Calif.

[73] Assignee: Applied Materials, Inc., Santa Clara, Calif.

[21] Appl. No.: 358,161

[22] Filed: Dec. 16, 1994

[51] Int. Cl.⁶ .................................................. C23C 16/00
[52] U.S. Cl. ......................... 118/715; 118/719; 118/720
[58] Field of Search ................................. 118/715, 719, 118/720

[56] References Cited

U.S. PATENT DOCUMENTS 4,978,412  12/1990  Aoki et al. ................................ 156/345

FOREIGN PATENT DOCUMENTS

0650181A2  10/1994  European Pat. Off. .

Primary Examiner—R. Bruce Breneman
Assistant Examiner—Felisa Garrett
Attorney, Agent, or Firm—Patterson & Streets

[57] ABSTRACT

A chamber for depositing a film layer on a substrate includes a support member on which the substrate is positioned for processing in the chamber, and a clamp ring suspended in the chamber on a chamber shield. The support member is positionable in the chamber to receive a substrate thereon, and further positionable to pass the substrate through the shield and thereby lift the clamp ring off the shield. After deposition is complete, the support member retracts through the shield, to reposition the clamp on the shield. In the event that a deposition material layer has formed between the substrate and the clamp ring, the clamp ring includes a plurality of actuators thereon which force the substrate out of the clamp ring as the clamp ring is repositioned on the shield.

14 Claims, 9 Drawing Sheets

CLAMP RING FOR SHIELDING A SUBSTRATE DURING FILM LAYER DEPOSITION

BACKGROUND OF THE INVENTION

FIELD OF THE INVENTION

The present invention relates to semiconductor substrate processing equipment. More particularly, the present invention relates to the deposition of film layers on substrates in order to fabricate semiconductor devices on the substrate. More particularly still, the present invention relates to the deposition of such film layers wherein the edge of the substrate is shielded from the deposition environment, and the deposition material may form a bridging film layer between the substrate and an adjacent chamber component such as a clamp ring.

BACKGROUND OF THE INVENTION

The fabrication of semiconductor devices on substrates, including semiconductor substrates, typically requires the deposition of multiple metal, dielectric and semiconductor film layers on the surface of the substrate. The film layers are typically deposited on the substrates in vacuum chambers. One deposition process is sputtering, wherein a target comprised of the deposition material is exposed to a plasma and atoms or larger particles of target material are sputtered from the target and are deposited on the substrate. A second deposition process is chemical vapor deposition, wherein a chemical vapor is exposed to the substrate and a film layer of the vapor components may be formed on the substrate.

To support the substrate in the chamber, a support member, commonly a susceptor or a pedestal, is located in the chamber. The substrate is placed on, and secured to, the upper surface of the support member during the deposition process.

To form the deposition layer on the substrate, a deposition environment must be created within the chamber adjacent to the deposition receiving surface of the substrate. In a chemical vapor deposition chamber, the deposition environment is a chemical vapor which, when contacted with the substrate, deposits onto the substrate to form the deposition layer. In a physical vapor deposition system, the deposition environment includes a plasma maintained between a target and the deposition receiving surface of the substrate and a flux of sputtered target particles passing between the target and the deposition receiving surface of the substrate. A portion of the sputtered target particles deposit on the substrate to create the deposition layer.

In both the chemical vapor deposition and physical vapor deposition systems, the deposition material will, if left unconfined, deposit on all of the interior surfaces of the chamber. Therefore, shield arrangements have been devised to restrict the deposition environment to a region adjacent to the deposition receiving surface of the substrate. The shield system typically includes a fixed wall portion which extends between the chamber cover and the position within the chamber where the pedestal is positioned during the deposition. The fixed wall portion extends around the circumference of the pedestal when the pedestal is positioned for the deposition, and it thus blocks access of the deposition environment to the walls and interior components of the chamber. However, a small gap must be provided between the pedestal and the shield, to allow the pedestal to retract and extend in the chamber without the risk of the pedestal contacting the fixed wall portion.

The gap between the inner terminus of the fixed wall portion and the pedestal provides a path for deposition material to enter the regions of the chamber which are protected by the fixed wall portion and deposit an undesirable film layer on these surfaces. Therefore the gap is covered, typically by placing an annular ring over the gap. The ring is commonly known as a clamp ring, because it can also serve as the means for securing the substrate to the pedestal. The clamp ring typically includes a lip, which extends inwardly of the pedestal and over the edge of a substrate received on the pedestal. The lip is sized to extend inwardly over the substrate by a distance which is sufficient to block access of the deposition material to the substrate edge below the lip and from the juncture of the clamp ring with the pedestal, and is further sized to provide a small space between the underside of the lip and the upper surface of the substrate. Without the lip, deposition material could form a bridging layer between the substrate and the pedestal which could interfere with the easy removal of the substrate from the pedestal.

Although the clamp ring with the overhanging lip prevents the formation of a film layer between the substrate and the pedestal, deposition material may still deposit on the inner edge and underside of the lip and eventually bridge the space between the upper surface of the substrate and the lip. This bridging film layer may be strong enough to attach the substrate to the clamp ring, in which case the chamber must be shut down to remove the substrate and the entire substrate will be rendered worthless. In the worst case, the substrate may maintain an attachment to the clamp ring for only a short period of time, after which it falls in the chamber. In that case, the chamber components might also be damaged. To prevent this, the clamp ring must be periodically replaced with a clean clamp ring on a regular maintenance schedule. However, on occasion a bridging deposition material layer may still form between the substrate and the lip.

Therefore, there exists a need in the art for a shield arrangement that will provide shielding of the substrate edge while eliminating, or substantially reducing, the risk of substrate attachment to the clamp ring.

SUMMARY OF THE INVENTION

Our invention is an annular clamp ring for use in a chamber for depositing a film on a semiconductor substrate. The clamp ring includes a base, which may be comprised of a plurality of individual spacer members, adapted to rest on the top face of the substrate, a roof extending outward of the base and generally parallel to the substrate, and an annular lip extending inward of the base and which overhangs an annular region near the perimeter of the substrate, thereby shielding the region below the lip from the deposition environment. The clamp ring is preferably positioned over the edge of the substrate during deposition, and is preferably positioned on a hanger, such as the chamber shield, during the loading and unloading of the substrate from the chamber.

Uniquely, the clamp ring includes one or more biasing members which provide a force to push the substrate from the clamp ring in the event that a film layer has formed between the substrate and the clamp ring.

In one embodiment of the invention, the biasing members are springs, mounted beneath the roof of the clamp ring, which are compressed when the clamp ring rests on the substrate, and which provide a force to separate the clamp ring from the substrate when the substrate support is lowered after completion of the deposition of a film layer on the substrate. Each spring is oriented so that, in its noncompressed state, its longitudinal axis is at a slight angle relative to the plane of the substrate, and so that, when compressed by the weight of the clamp ring resting on the substrate, the spring deflects to a reduced angle relative to the plane of the substrate.

The spring constants of the springs are selected so that the total force they provide between the clamp ring and the substrate is less than the mass of the ring, but is preferably large enough to overcome the adhesive strength of any thin deposition layer that may be present between the substrate and the lip. In specific preferred embodiments, the springs are either leaf springs or torsion springs.

In an alternative embodiment of the invention, the biasing member is a unique rocker arm arrangement which ensures separation of the substrate from the clamp ring, but does not contact the substrate during processing. The rocker arm arrangement includes a plurality of rocker arms located on the underside of the clamp ring. Each rocker arm is mounted on a shaft and is freely rotatable thereon. Each rocker arm also includes a substrate engaging portion extending from the shaft and to a position adjacent to the lip of the clamp ring slightly inwardly of the spacer extending downwardly from the underside of the lip, and a rearwardly extending trigger portion extending under the roof.

The engagement portion preferably terminates in a bearing portion, which extends inwardly from a protrusion extending downwardly from the underside of the engagement portion. This downward protrusion contacts the substrate support member adjacent to the edge of the substrate as the clamp ring is received on the support member, and thereby spaces the bearing portion above the upper surface of the substrate. The mass of the trigger portion preferably exceeds the mass of the engagement portion. Additionally, the clamp ring preferably includes recesses therein, into which the engagement portion may be received.

In operation, the clamp ring is initially positioned on a hanger, such as the chamber shield, surrounding the periphery of the support member. The clamp ring does not contact the shield, but is supported on the shield through the trigger portions of the rocker arms. The positioning of the trigger portions on the shield extends the engagement portions of the rocker arms downwardly from the underside of the clamp ring. As the support member moves upwardly in the chamber, the protrusions on the engagement portions engage the edge of the support member outwardly of the edge of the substrate positioned thereon. Further movement of the support member upwardly in the chamber moves the clamp ring sufficiently upward, with respect to the shield, so as to lift the trigger portions off the shield. Because the mass of the trigger portion exceeds the mass of the engagement portion, the rocker arm rotates about the shaft to lift the protrusion off the support member and simultaneously recess the engagement portion into the recess in the clamp ring. Thus, once the clamp ring is positioned on the support member and the support member is positioned for processing of the wafer, no contact exists between the actuation member and the support member or the substrate.

After processing, the support member moves downwardly in the chamber to reposition the clamp member on the shield, and to position the substrate for removal from the chamber. As the support member moves from the processing position, the trigger members engage the shield, thereby actuating the engagement portions downwardly from the recesses. As the support member continues moving downwardly in the chamber, the protrusions on the engagement portions will engage the periphery of the pedestal and thereby prevent contact between the bearing portion and the substrate. If the deposition layer has not formed a bridging layer between the substrate and the clamp ring, the substrate will remain in contact with the support member as the clamp ring is repositioned on the shield, and no contact will occur between the engagement portion and the substrate. However, if the substrate becomes adhered to the clamp ring, the bearing portion of the rocker arm extending beyond the protrusion will engage the edge of the substrate and push it from the clamp ring.

The rocker arm provides the separation of the clamp ring from the substrate without contacting the rocker arm with the substrate during processing, which reduces the likelihood that the substrate will be damaged by the rocker arm. Additionally, the rocker arm provides a repeatable separation force between the substrate and the clamp ring which does not change over the life of the clamp ring.

DESCRIPTION OF THE PREFERRED EMBODIMENT

The substrate shield and clamp system of the present invention prevents material being deposited on a semiconductor substrate from being deposited on the periphery of a substrate and on the adjacent surface of the substrate support pedestal, while facilitating separation of the clamp ring from the substrate even when the material deposited on the substrate has bridged the gap between the substrate and the clamp ring. The invention is useful for any type of deposition chamber for semiconductor fabrication, such as a physical vapor deposition (PVD) chamber or a chemical vapor deposition (CVD) chamber for depositing a conductor, semiconductor or dielectric film on a substrate.

The invention will be described below in a preferred implementation within a conventional PVD chamber for depositing a metal film on a semiconductor substrate. Before describing the unique features of the invention, the conventional components of the chamber are described.

Conventional Deposition Chamber Components

Figure 1:
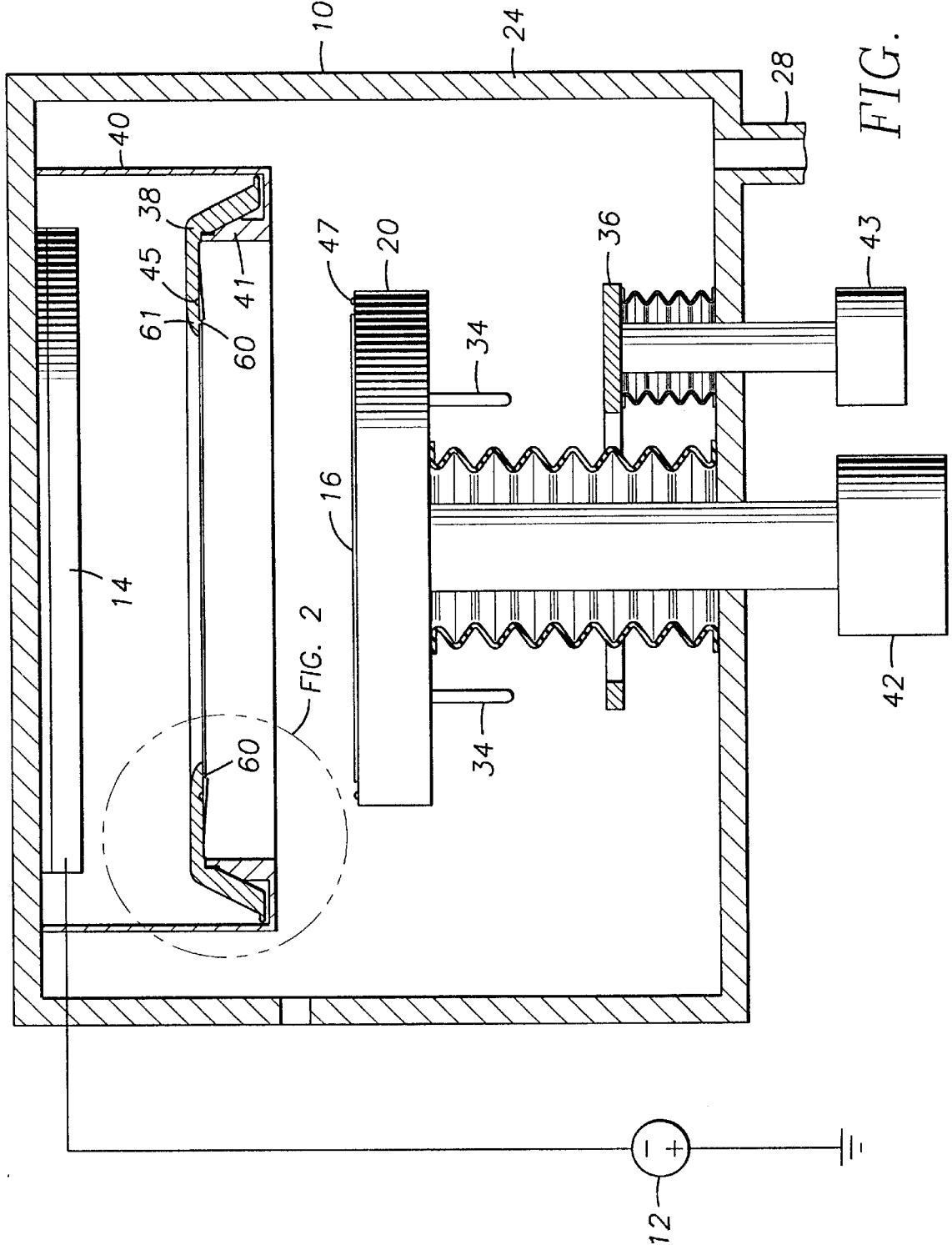
FIG. 1 is a sectional view of a deposition chamber showing the arrangement of the shield and the support member in a deposition chamber wherein the support member is positioned below the clamp ring and shield.

FIG. 1 is a simplified sectional view of a conventional sputtering chamber 10 including the clamp ring 38 of the present invention. The chamber 10 generally includes a chamber enclosure wall 24, having at least one gas inlet (not shown) and an exhaust outlet 28 connected to an exhaust pump (not shown). A substrate support pedestal 20 is disposed at the lower end of the chamber 10, and a target 14 is received at the upper end of the chamber 10. The target 14 is electrically isolated from the enclosure wall 24 and the enclosure wall 24 is preferably grounded, so that a negative voltage may be maintained on the target 14 with respect to the grounded enclosure wall 24. A shield 40 is suspended from the chamber cover, and this shield includes an annular, upturned, wall 41 on which the clamp ring 38 may be suspended over the pedestal 20 when the pedestal 20 is retracted downwardly in the chamber 10 as shown in FIG. 1.

In preparation for receiving a new semiconductor wafer or substrate 16 into the chamber 10, the substrate support pedestal 20 is lowered by a drive mechanism well below the clamp ring 38 suspended on the shield 40, and so that the bottom of the pedestal 20 is close to a pin positioning platform 36. The pedestal 20 includes three or more vertical bores (not shown), each of which contains a vertically slidable pin 34. When the pedestal 20 is in the lowered position just described, the bottom tip of each pin 34 rests on the platform 36, and the upper tip of each pin 34 protrudes above the upper surface of the pedestal 20. The upper tip defines a plane parallel to the upper surface of the pedestal 20.

A conventional robot arm carries a semiconductor substrate 16 into the chamber 10 and places the substrate 16 above the upper tips of the pins 34. A lift mechanism 43 moves the pin platform 36 upwardly, to place the upper tips of the pins 34 against the underside of the substrate 16 and additionally lift the substrate 16 off the robot blade. The robot blade then retracts from the chamber 10, and the lift mechanism 43 raises the pedestal 20 so that the pins 34 slide down in the pedestal 20, thereby lowering the substrate 16 onto the top surface of the pedestal 20.

The lift mechanism 43 continues to raise the pedestal 20 so that the periphery of the substrate 16 contacts the inner portion of the annular clamp ring 38 resting on the upturned wall portion 41. The inner diameter of the clamp ring 38 is slightly smaller than the diameter of the substrate 16. As the pedestal 20 continues moving upward, the substrate 16 (supported by the pedestal 20) supports the entire weight of the clamp ring 38 and lifts it above the upturned wall portion 41. At this point, the positions of the described components are as shown in FIG. 1.

Figure 7:
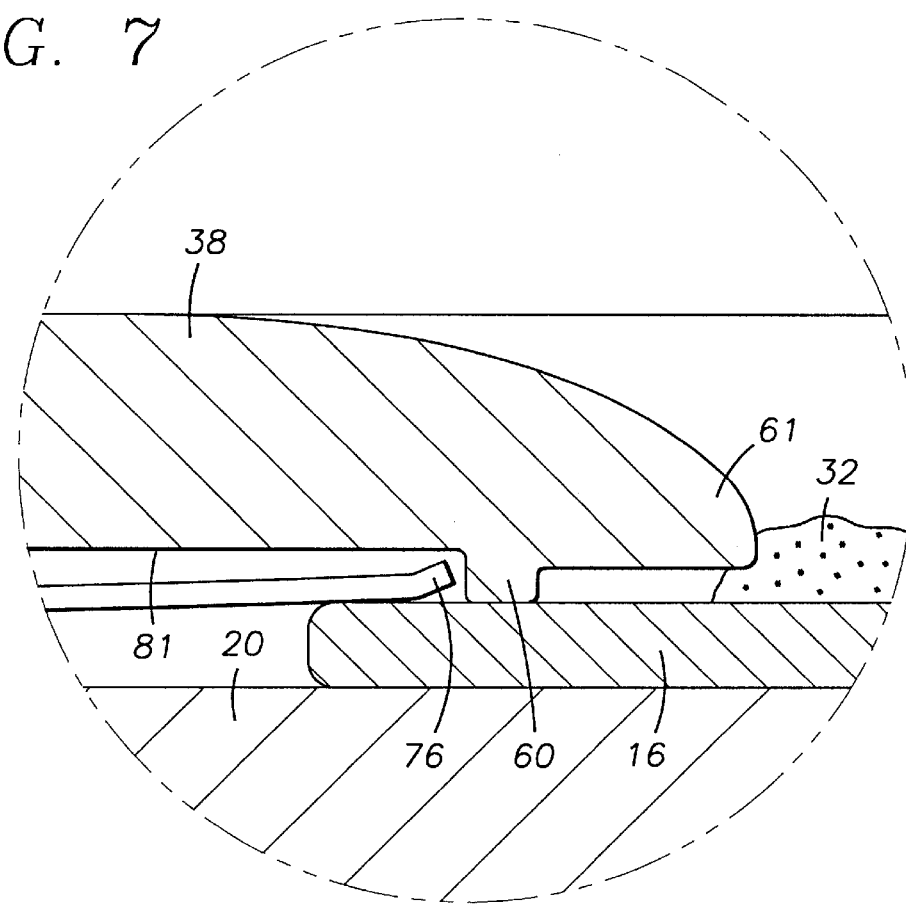
FIG. 7 is an enlarged view of the positioning of the clamp ring on the substrate.
Figure 2:
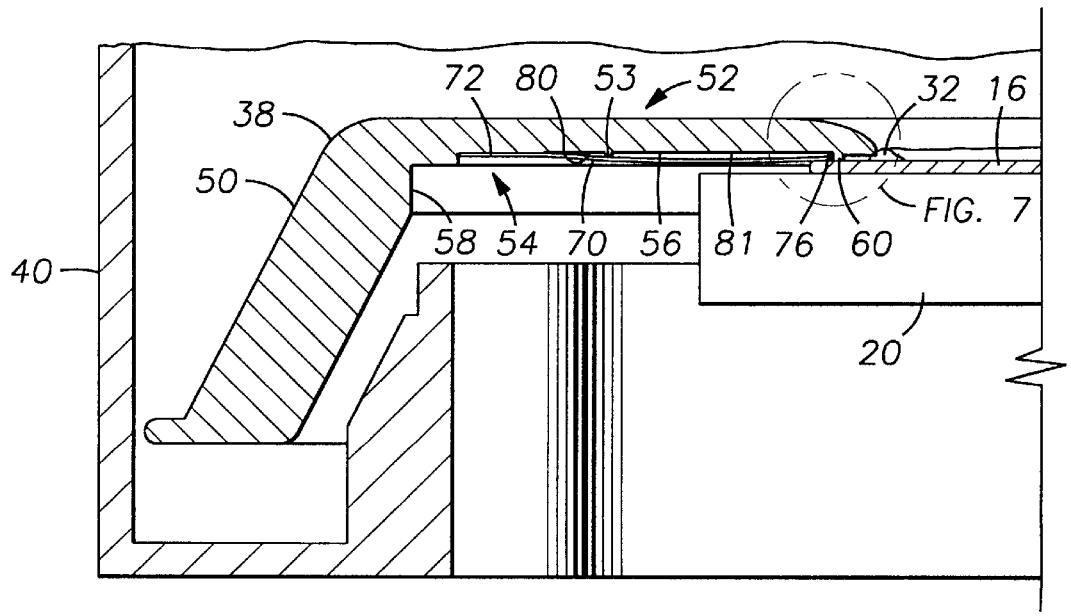
FIG. 2 is a partial sectional view of the interface of the shield, the support member and the substrate with the clamp ring received on the substrate.
Figure 3:
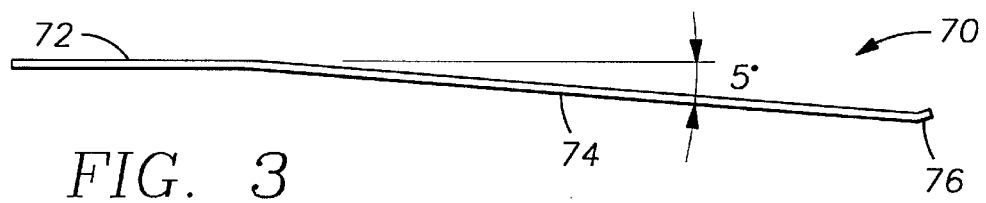
FIG. 3 is a side view of the spring of FIG. 2.

As shown in FIGS. 2 and 7, the clamp ring 38 includes an overhanging lip 61 which overhangs, but does not touch, the substrate 16 so as to shield the perimeter of the substrate 16 immediately below the lip 61 from receiving material being deposited on the substrate 16, and a plurality of spacers 60 extending downwardly from the lip 61, inwardly of the inner terminus of the lip 61, to space the lip 61 and the remainder of the clamp ring 38 from the substrate 16 and the pedestal 20. The spacers 60 form the base of the clamp ring 38 which rests on the upper surface of the substrate 16 during processing. The individual spacers 60 may be replaced with a continuous downwardly extending web to form a continuous base, if desired. The clamp ring 38 should be heavy enough to prevent the clamp ring 38 or the substrate 16 from sliding across the surface of the pedestal 20.

At this point, the film deposition process can begin. In the case of the exemplary sputtering chamber 10 shown in FIG. 1, a sputtering process gas (typically argon) is supplied to the chamber through the gas inlet (not shown), and a DC power supply 12 applies a negative voltage to the sputtering target 14. The voltage excites the argon gas to a plasma state, and argon ions bombard the negatively biased target 14 to sputter material off the target 14. The sputtered material then deposits on the substrate 16, except for the periphery thereof which is shielded by the clamp ring 38.

After the film layer has been deposited on the substrate 16, the substrate 16 is removed from the chamber 10 by reversing the sequence of steps by which it was carried into the chamber 10. Specifically, the lift mechanism 43 lowers the pedestal 20 below the upturned wall portion 41, so that the clamp ring 38 descends onto the shield. At this point the weight of the clamp ring 38 is supported by the shield 40, not by the substrate 16 and pedestal 20. Ideally, there should be no significant adhesion between the substrate 16 and the clamp ring 38, so that the substrate 16 simply will continue to rest on top of the pedestal 20 as the pedestal descends below the clamp ring 38 resting on the shield 40.

However, there is nothing to prevent sputtered material from depositing on the lip 61 of the clamp ring 38, and deposited material will accumulate on the lip 61 as successive substrates are processed in the chamber. Eventually, the material may accumulate to the point that it touches the surface of the substrate 16 located below the lip 61, so as to form a layer 32 of material bridging the gap between the clamp ring 38 and the substrate 16 as shown in FIG. 2. When this happens, the bridging material 32 can act as an adhesive attaching the substrate 16 to the clamp ring 38. Consequently, when the pedestal 20 descends below the shield 40, the substrate 16 may stick to the clamp ring 38 resting on the shield 40 rather than descending along with the pedestal 20.

If the substrate 16 sticks to the clamp ring 38 only temporarily and then falls onto the pedestal 20, it is likely to be damaged by the impact with the pedestal 20. If the substrate 16 adheres more strongly to the clamp ring 38 and does not fall off, then processing must be halted and the chamber 10 must be opened to manually remove the substrate 16. In either case, the substrate 16 becomes worthless. This is a particular problem in the case of metal deposition chambers, because metal conductors generally are the last layers to be deposited on a semiconductor substrate, after the substrate has becomes valuable because of the number of expensive fabrication steps previously performed on it.

Novel Features of Clamp Ring

The clamp ring 38 of the present invention prevents the wafer or substrate 16 from adhering to the clamp ring 38 as the pedestal 20 descends below the upturned wall 41, so that the substrate 16 will remain on the pedestal 20. It accomplishes this by means of a biasing member which supplies a force to push the substrate 16 out of the clamp ring 38 when the clamp ring 38 is redeposited on the upturned wall 41 of the shield 40. In one aspect of the invention, the biasing member is a spring which compresses between the clamp ring 38 and the substrate 16 when the weight of the ring is on the substrate 16 while the pedestal 20 is in its raised, or substrate processing, position. When the pedestal 20 descends so that the weight of the clamp ring 38 is transferred from the substrate 16 to the upturned wall 41, the spring pushes the substrate 16 away from the ring, overcoming the adhesive strength of any deposition material that may have bridged the gap between the substrate 16 and the overhanging lip 61 of the clamp ring 38.

As shown in FIG. 2, the preferred embodiment of the annular clamp ring 38 includes an annular, downward-extending, outer flange 50 from which an annular, horizontal roof 52 extends radially inward. The previously described spacers 60 and overhanging lip 61 are located at the inner circumference of the roof 52. Although FIGS. 1 and 2 show only longitudinal sections of the clamp ring 38, all elements of the clamp ring 38 have circular symmetry relative to the longitudinal axis of the clamp ring 38, so the 3-dimensional structure of the clamp ring 38 should be apparent from the Figures.

Figure 4:
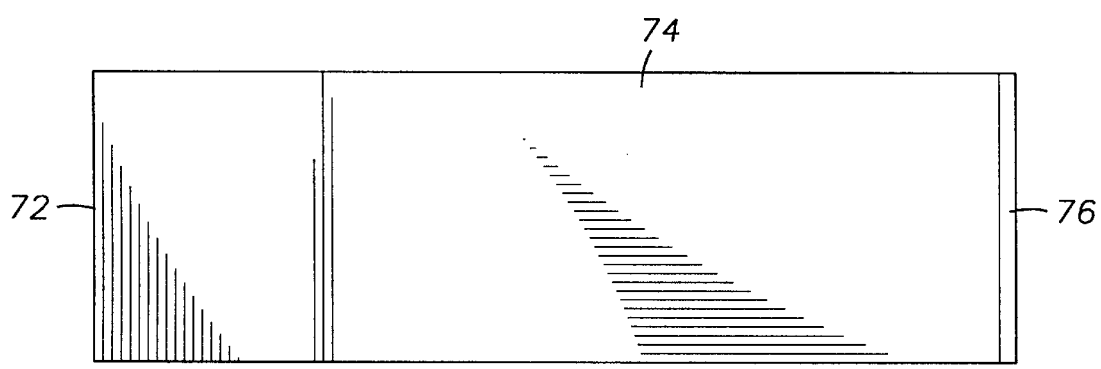
FIG. 4 is a plan view of the preferred spring used with the clamp ring shown in FIG. 2.
Figure 5:
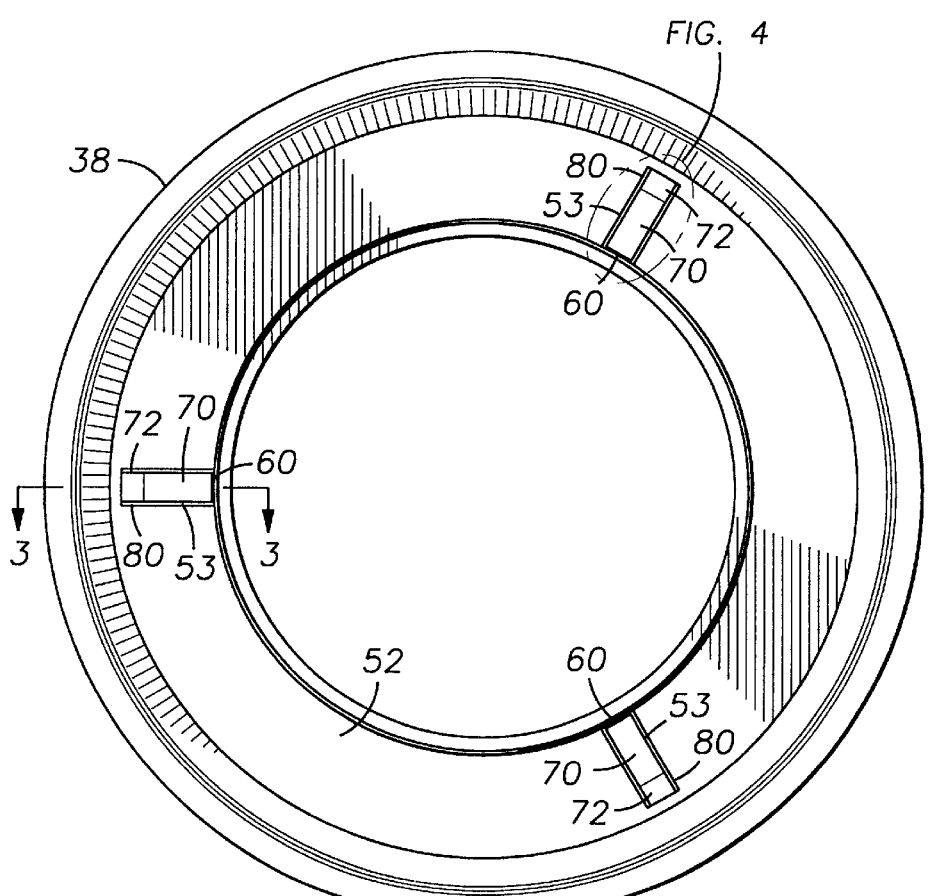
FIG. 5 is a bottom view of the clamp ring shown in FIG. 2.
Figure 8:
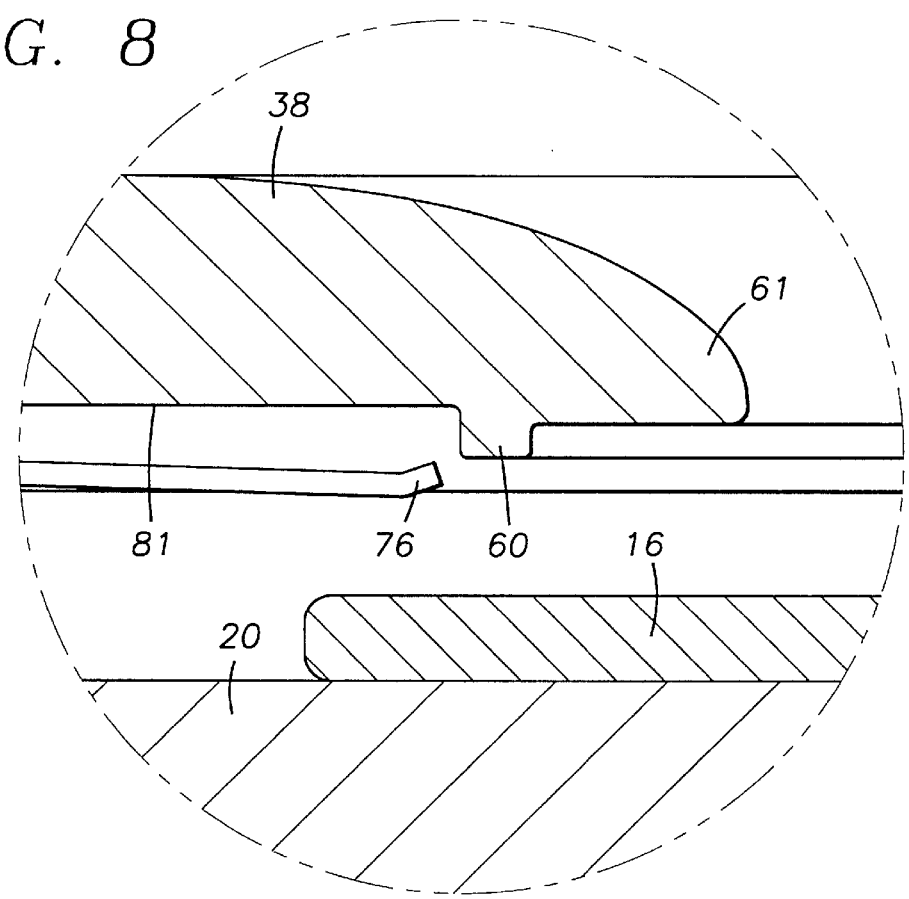
FIG. 8 is an enlarged view of the of the relationship of the clamp ring, substrate and substrate support member immediately before the clamp ring is received on the substrate or immediately after the clamp ring is lifted off the substrate.
Figure 6:
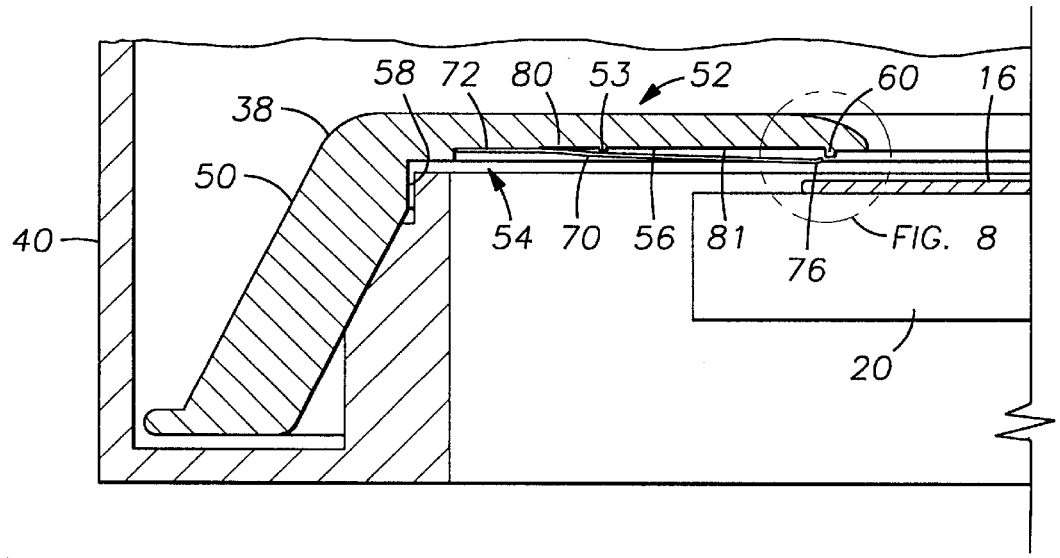
FIG. 6 is a partial sectional view of one relationship of the clamp ring, substrate and substrate support member immediately before the clamp ring is received on the substrate or immediately after the clamp ring is lifted off the substrate.

As shown in FIG. 5, the underside of roof 52 contains three recesses 80, each extending radially outward from one of the spacers 60. In the preferred embodiment, only three spacers are provided on the underside of the clamp ring 38, and the recesses 80 are radially aligned with the spacers 60. Each recess 80 houses a generally rectangular leaf spring 70. The three recesses 80 are equally spaced from each other circumferentially. That is, the recesses 80 are spaced apart by 120°. Each spring 70 includes an outer end 72 which is welded, or otherwise securely attached such as with a screw secured into a bore provided therefore, to the underside of the roof 52 within the recess 80, and an inner portion 74 extending inwardly from the outer end 72 and terminating in a contacting portion 76 which forms the inner terminus of the spring 70. The inner portion 74 is positioned at an angle with respect to the lower surface of the roof, preferably at about a 5° angle as shown in FIG. 4. This angle is partially provided by extending a boss from the underside of the roof within the recess 80, the outermost surface of which provides a fulcrum 53 about which the inner portion 74 may be deflected as the contacting portion 74 contacts the substrate. Importantly, this downward deflection angle must be great enough so that when the leaf springs are un-compressed as shown in FIGS. 6 and 8, the contacting portion 76 of each leaf spring 70 extends below the spacer 60.

The length of each spring 70 is critical because it must satisfy two criteria. First, the spring 70 must be short enough so that when the spring is compressed against a substrate 16, as shown in FIGS. 2 and 7, the spring 70 will be pushed inside the recess without rubbing against the spacer 60. Second, the spring 70 must be long enough to extend over the perimeter of the substrate 16 as shown in FIG. 7.

The spring will expand and contract in response to heating and cooling during different portions of the film deposition process. The length of the spring 70 must continue to satisfy the two stated criteria at all temperatures it will encounter. In particular, if at any temperature the spring 70 is too long, it can break off the spacer 60. If at any temperature the spring 70 is too short, it can rub against the outer edge of the substrate 16, possibly chipping or cracking the substrate 16. Accordingly, the leaf spring 70 preferably is fabricated of a material having a low thermal expansion coefficient, such as Inconel.

The inner tip, or contacting portion 76, of each spring 70 also must be positionable on the upper surface of the substrate 16 directly adjacent to the edge of the substrate 16. To ensure that the tips are so positioned, the pedestal 20 includes a plurality of tapered pins 47 extending upwardly from the upper surface of the pedestal 20 about the perimeter of a substrate 16 received on the pedestal 20, and the clamp ring 38 includes a corresponding plurality of alignment recesses 45 therein. When the clamp ring 38 is received on the pedestal 20, the pins 47 are received within the alignment recess 45, to align the clamp ring 38 with the pedestal 20 to ensure the desired alignment therebetween.

The contacting portion 76 of each leaf spring 70 preferably is bent upward relative to the adjoining portion 74 of the spring so that the inner edge of the spring will not contact, and possibly scratch, the substrate 16.

In the free condition of the spring 70, as shown in FIG. 6, the planar surface of the contacting portion 76 is disposed parallel to the mounting recesses 80, 81. Thus, the planar surface of the contacting portion 76 which engages the substrate 16 is preferably parallel to the top-most surface of the substrate 16 when the contacting portion 76 first engages the substrate 16 as shown in FIG. 9.

In operation, before a new substrate is carried into the deposition chamber 10, a lift mechanism 43 lowers the substrate support pedestal 20 below the upturned wall 41, as described earlier. A robot places the substrate 16 above pins 34 extending above the top surface of the support pedestal 20, and the pin platform 36 moves upwardly to move the pins 34 upwardly to lift the substrate 16 off the robot blade. Then, after the robot blade retracts, the lift mechanism 43 raises the pedestal 20 so that the pins retract and the substrate 16 is carried upward while resting on the top surface of the pedestal 20. FIGS. 6 and 8 show the apparatus at his point in time, just before the substrate 16 ascends to contact the base 60 of the clamp ring 38.

Figure 9:
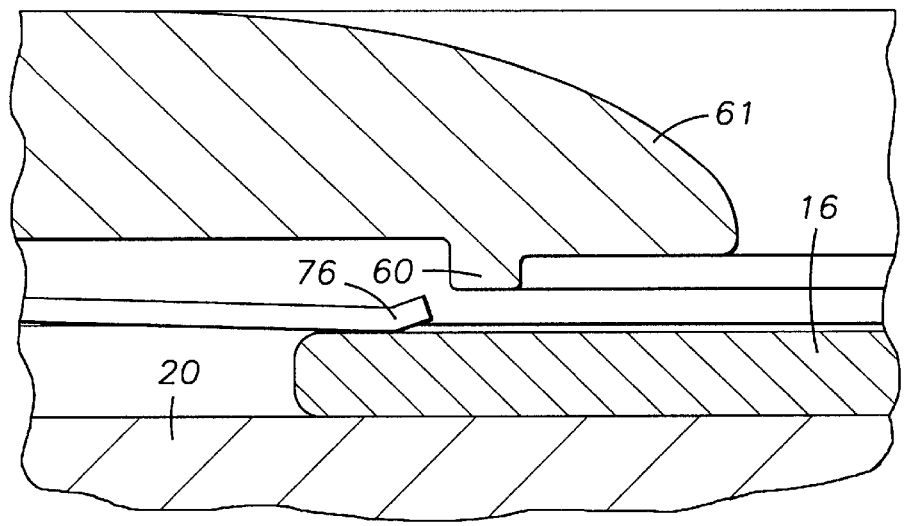
FIG. 9 is an enlarged view of the of the relationship of the clamp ring, substrate and substrate support member showing the substrate just contacting the biasing member of the clamp ring.

As the lift mechanism 43 continues raising the pedestal 20, a portion of the surface on the top of the substrate 16, near its perimeter, contacts the inner portion 76 of the spring 70 as shown in FIG. 9, and then compresses the spring until the substrate 16 rises to abut the spacers 60 of the clamp ring 38. The boss 53 functions as a fulcrum about which the inner portion 74 of the spring bends as shown in FIGS. 2 and 4. As the pedestal 20 continues ascending, the substrate 16 supports the entire weight of the clamp ring 38 and lifts it above the upturned wall 41. At this point, the positions of the described components are as shown in FIGS. 1 and 2. The lift mechanism stops raising the pedestal 20 when the substrate 16 reaches the desired position near the sputtering target 14, or other deposition source, in order for the film deposition process to begin.

In the deposition process, target material sputtered from the target 14 deposits on the substrate 16, and the roof 52 substantially shields the perimeter of the substrate 16 and the inner circumferential face 58 and the underside 56 of the clamp ring 38 from deposition material. However, material also will be deposited on the roof 52 and overhanging lip 61 of the clamp ring 38. The resulting layer 32 of material accumulates, thus increasing in thickness as successive substrates are processed in the deposition chamber 10. The layer 32 can grow thick enough to bridge the gap between the overhanging lip 61 and the substrate 16 as shown in FIG. 2, and this bridging layer 32 can act as an adhesive bonding the substrate 16 to the lip 61 of the clamp ring 38.

After the deposition of a film on the substrate 16 is completed, the lift mechanism 42 lowers the substrate support pedestal 20. The substrate 16 and the clamp ring 38 descends along with the pedestal 20 until the clamp ring 38 comes to rest on the upturned wall 41. At this point, the clamp ring 38 cannot descend any further, while the pedestal 20 continues to descend.

Ideally, the wafer or substrate 16 should remain resting on the pedestal 20 and should descend along with the pedestal 20 even after the clamp ring 38 comes to rest on the upturned wall 41. However, as described above, a bridging layer 32 of material may bond the substrate 16 to the lip 61 of the clamp ring 38. In our invention, the adhesive or bonding strength of the layer 32 of bridging material is overcome by the leaf spring 70. Because the spring 70 was compressed when the clamp ring 38 and the substrate 16 were brought into contact at the beginning of the deposition process, described earlier, the spring exerts a downward force on the substrate 16 tending to separate the substrate 16 from the clamp ring 38. The leaf spring 70 should be composed of a material having a spring constant sufficient to overcome the adhesive strength of the layer 32 of bridging material.

Preferably, each of the three leaf springs 70 provides, in its compressed state, a force of about 0.2 to 0.3 pounds between the substrate 16 and the clamp ring 38, for a total force of about 0.6 to 0.9 pounds. In general, the springs should be designed to provide a total force in their compressed state which is sufficient to overcome the adhesive strength of the layer 32 of bridging material, but which is substantially less than the weight of the clamp ring 38. The latter requirement ensures that the clamp ring 38 will rest firmly on the substrate 16 with sufficient static friction against the substrate 16 to prevent the clamp ring 38 from sliding across the substrate 16.

The springs 70 ensure the separation of the substrate 16 from the clamp ring 38 with minimal particle generation, and with a continuously reproducible load force and free state position of the spring 70. The moving portions of the spring 70, i.e., the connection of the extending portion 74 and the mounting portion 72, are substantially protected from the deposition environment by the roof 52, the recesses 80, 81 and the spacer 60. Likewise, the engagement region of the fulcrum against the extending portion 74 is protected from the deposition environment by the roof 52. Additionally, the only non-stationary contact between the spring 70 and the clamp ring 38 occurs at the fulcrum 53, which has minimal surface area as the contact region between these elements is substantially line contact between the curved end of the fulcrum 53 and the planar surface of the extending portion 74. Therefore, there is minimal opportunity for particle generating contact between the spring 70 and the adjacent surfaces of the clamp ring 38. Likewise, because there is minimal contact between the moving portions of the spring 70 and the clamp ring 38, the spring 70 will return to its free state without binding on adjacent surfaces of the clamp ring 38, and the position of the contacting portion 76 in the free state is reproduced during each engagement and disengagement of the clamp ring 38 with the substrate 16.

Figure 10:
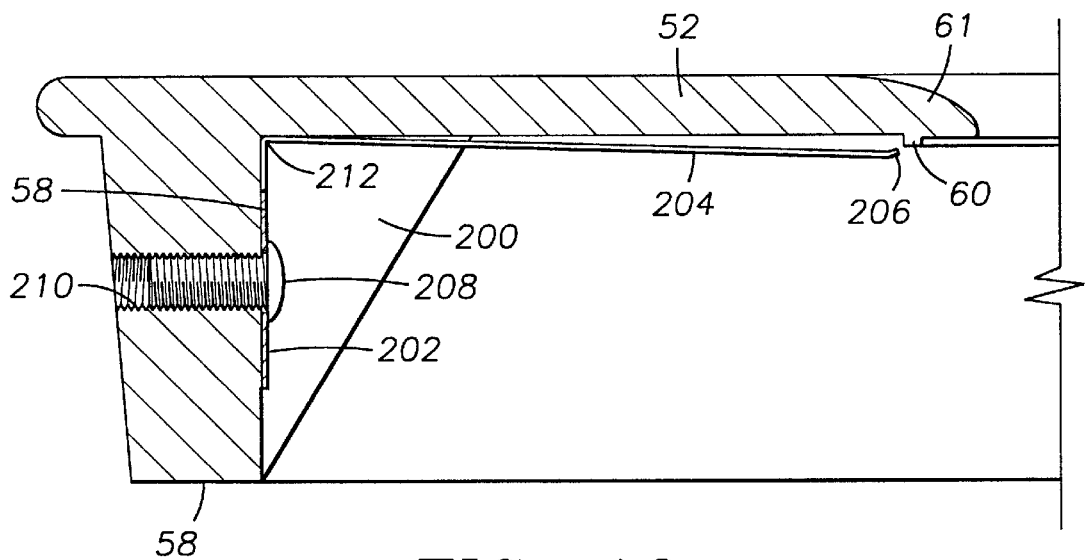
FIG. 10 is a partial sectional view of the clamp ring showing an alternative configuration of the spring.
Figure 15:
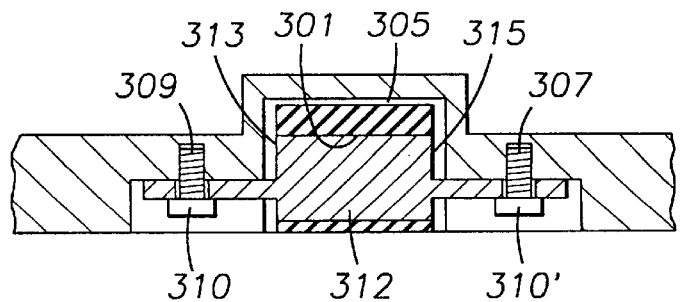
FIG. 15 is a sectional view of the clamp ring of FIG. 11 at section 15—15.

Referring now to FIG. 10, a sectional view of the clamp ring 38 showing an alternative embodiment of the spring mechanism is shown. In this embodiment, each of the three spring members are one-piece torsion springs 200, having a mounting portion 202 affixed to the inner circumferential surface 58 of the clamp ring 38, and an engagement portion 204 extending radially inwardly from the mounting portion 202 and downwardly from the roof 52, and terminating in a free end forming an engagement face 206. Additionally, in this embodiment the clamp ring 38 is not modified by the inclusion of the recesses 80, 81, or the fulcrum 53, as is necessary with the spring 70. To attach the spring 200 to the clamp ring 38, two screws 208 preferably extend though the mounting portion and are fixed within threaded holes in the circumferential surface 58.

In the free state of the spring 200., i.e., where the clamp ring 38 is not received on the substrate 16, the extending portion 204 extends downwardly from the underside of the roof 52 at an angle of approximately 5°, and extends outwardly from the mounting portion 202 at an angle of approximately 85°. The mounting portion 202 and the extending portion 204 are formed from a continuous length of spring stock, preferably a planar length of Inconel, which is bent to form a rotary joint 212. The spring material is of sufficient stiffness, and size, so that the extending portion does not substantially deform as the engagement face 206 thereof engages the upper surface of a substrate 16, so that the extending portion 204 will move upwardly about the rotary joint 212 as the spring 200 engages a substrate 16.

Additionally, the material from which the spring 200 is formed must be sufficiently conformable to enable the extending portion 204 to articulate toward the underside of the lip 61 as the clamp ring 38 and spring 200 are received on a substrate 16. By properly combining the stiffness of the material, the spring force applied by the spring 200 to push the substrate 16 out of the clamp ring 38 when a bridging film layer is formed between the substrate 16 and the clamp ring 38 is supplied by the torsional loading of the rotary connection 212, which occurs when the substrate 16 engages the spring 200.

The spring 200 must also have sufficient thermal stability, i.e., a sufficiently low coefficient of thermal expansion, so as to avoid engagement of the engagement face 206 of the spring 200 against the adjacent interior face of the spacer 60 when the clamp ring 38 is received on a substrate 16, and to ensure that in a cold state, where the clamp ring 38 is first received on the substrate 16, the engagement face 206 extends sufficiently inwardly of the circumferential surface 58 to ensure that the engagement face 206 is received on the upper surface of the substrate 16. Additionally, the engagement face 206 is bent upwardly with respect to the extending portion, so that the engagement portion 206 presents a flat, planar face as the substrate 16 is engaged against it.

As in the leaf spring embodiment, the torsion springs, in their compressed state, should provide a total force between the substrate 16 and the clamp ring 38 sufficient to overcome the bonding strength of a bridging layer 32 of deposition material, but substantially less than the weight of the clamp ring 38.

The Rocker Arm Embodiment

FIGS. 11 to 15 show an additional alternative structure for ensuring the separation of the substrate from the clamp ring 38 where a film layer has formed between the substrate and the clamp ring 38. In this embodiment of the invention, each of the springs of the embodiments of the invention shown in FIGS. 1 to 10 are replaced with rocker arms 300 which, in cooperation with the fixed wall 41 of the shield, operate to push a substrate out of the clamp ring 38 as the clamp ring 38 is re-positioned on the upturned wall 41 of the shield 40 after deposition on the substrate 16 is completed. Uniquely, the rocker arm 300 cooperates with the shield 40 to provide a repeatable, predictable force on the upper surface of the substrate 16 to press the substrate 16 from the clamp ring 38 when a film layer has formed between the substrate and the clamp ring 36, but it does not engage the substrate 16 if the substrate 16 does not become attached to the clamp ring 38.

Referring to FIGS. 11 to 15, there is shown an exemplary rocker arm 300 and the modifications to the clamp ring 38 needed to mount the rocker arm 300 thereto. The structure and operation of each of the rocker arms 300 is the same. Therefore, only one of the rocker arm 300 will be described. Each of the rocker arms 300 includes a central portion 302 having a bore 301 therethrough, a forwardly extending engagement portion 304 extending inwardly of the clamp ring 38, and a trigger portion 306 extending rearwardly from the central portion 302.

To locate the rocker arms 300 on the clamp ring 38, the roof of the clamp ring 38 includes a plurality of upwardly extending hood portions 305, one for each rocker arm 300, located between two threaded holes 307, 309 extending into the roof portion. To secure each rocker arm 300 within its hood portion 305, a pin 312 is extended through the bore 301 in the central portion 302 of the rocker arm 300, and the opposed ends 313, 315 (shown only in FIG. 15) of this pin 312 are secured in the two threaded holes 307, 309 by screws 310, 310' (best shown in FIG. 15). The relative size of the pin 312 and the bore 301 allows the rocker arm 300 to freely rotate about the pin 312, while the outer surface of the pin 312 serves as a cylindrical bearing on which the surface of the bore 301 rides. The rocker arm 300 is sized and positioned to ensure that the trigger portion 306 is selectively engageable with an upturned wall 41 of the shield 40, and the engagement portion 304 is selectively engageable with the surface of a substrate support member 20 where no film layer has formed between the clamp ring 38 and the substrate, and is engageable with the substrate 16 when a film layer has formed to connect the substrate to the clamp ring 38, as will be further described herein.

Figure 11:
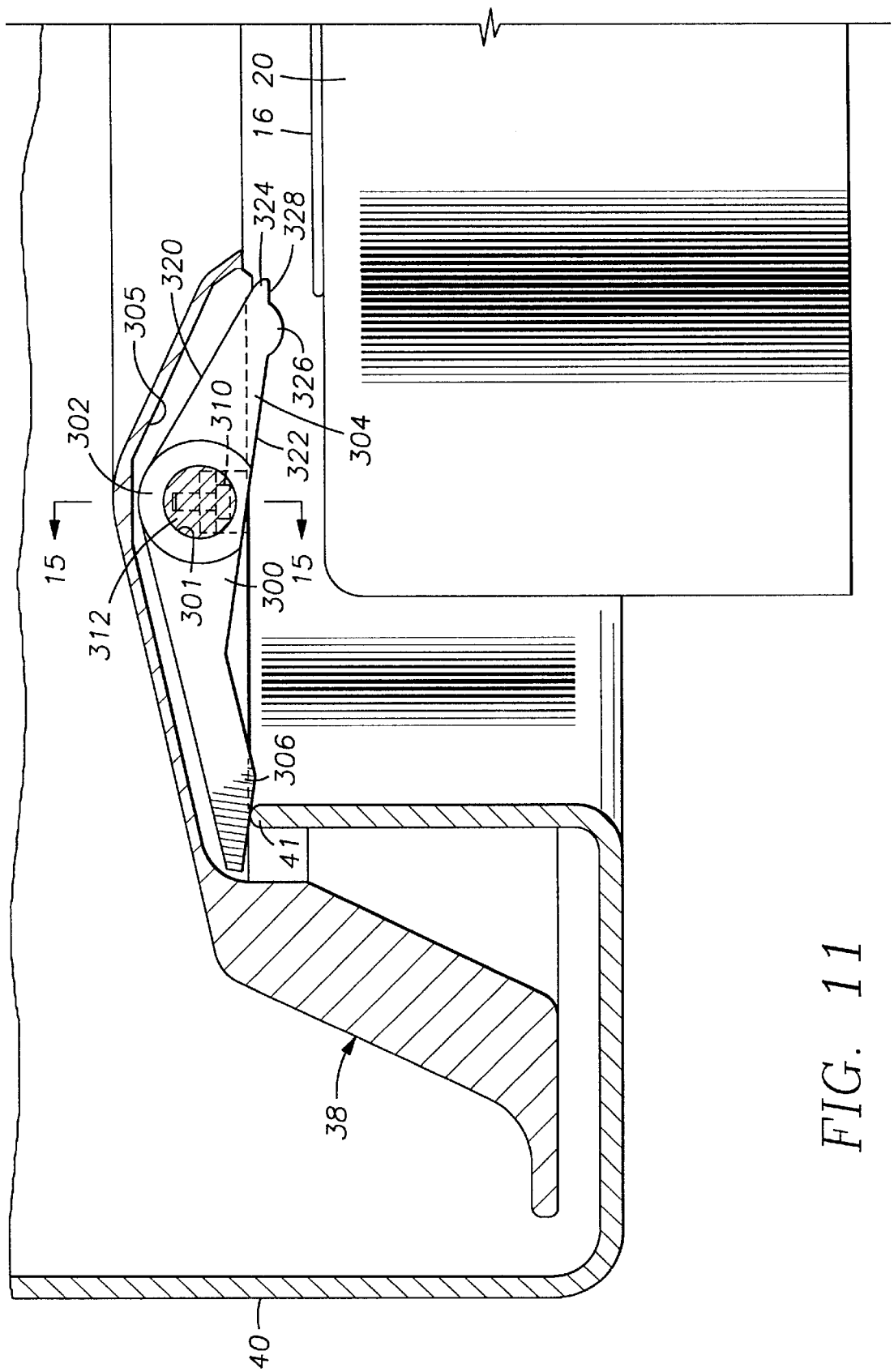
FIG. 11 is a partial sectional view of the relationship of a further alternative embodiment of the clamp ring, including a further alternative embodiment of the biasing member of the present invention, with a substrate and pedestal wherein the wherein the clamp ring is suspended on the chamber shield.

Referring still to FIG. 11, the engagement portion 304 of the rocker arm 300 has a wedge shaped profile having an upper wall 320 and a lower wall 322 which terminate at a tip 324. Additionally, a pedestal contact protrusion 326 extends downwardly from the lower wall 322 inwardly of the tip 324, and a planar substrate engaging portion 328 extends between the protrusion 326 and the tip 324. The face of the planar substrate engaging portion 328 is located at a slight angle with respect to the plane of the lower wall 322, which allows the planar substrate engaging portion 328 to be located parallel to the upper surface of the substrate 16 when it is also located collinear with the plane defining the underside of the roof as the rocker arm 300 is rotated about the pin 312. This ensures that in the event the substrate 16 becomes adhered to the roof portion, a flat surface, i.e., the planar substrate engaging portion 328, will engage the upper surface of the substrate 16 to push it from the clamp ring 38.

The planar substrate engaging portion 328 and the protrusion 326 are sized, and positioned relative to each other and the tip 324, to ensure that the substrate engaging portion 328 will not engage the substrate unless the substrate becomes attached to the clamp ring 38. As with the spring embodiments, the size, location and materials comprising the rocker arm 300 must be selected to ensure that the rocker arm 300 does not engage the spacers, but will engage the upper surface, and only the upper surface, of the substrate when necessary to push the substrate from the clamp ring 38, but not touch the substrate.

Figure 14:
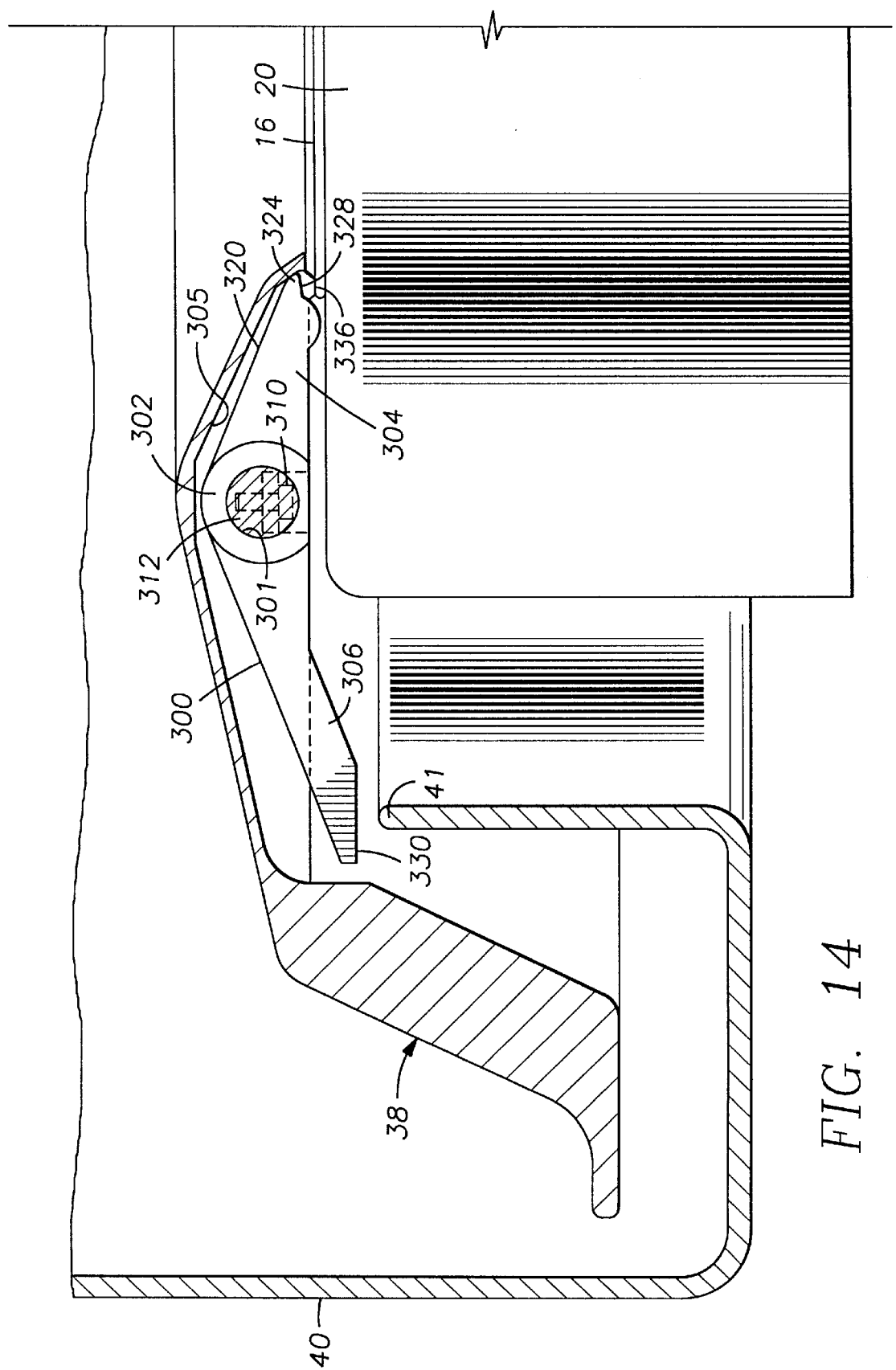
FIG. 14 is an additional partial sectional view of the clamp ring, substrate and substrate support of FIG. 11, wherein the biasing member is recessed into the clamp ring.

The trigger portion 306 extends rearwardly from the central portion 302 to form a counterweight to maintain the engagement portion 304 in an upwardly biased position within the hood portion 305 when the clamp ring 38 is positioned on the substrate (as shown in FIG. 14), and it also includes a planar shield engaging portion 330 which selectively engages the upturned wall 41 of the shield 40 to support the clamp ring 38 on the shield 40 when the clamp ring 38 is not positioned on the substrate (as shown in FIG. 11). The shield engaging portion 330 provides the entire contact between the shield 40 and the clamp ring.

Referring now to FIG. 14, there is shown the contacting relation of the clamp ring 38 on the substrate when the clamp ring 38 is positioned for processing of the substrate 16 in the chamber 10. The clamp ring 38 includes a bearing flat 336, which is formed of the lower face of a web which extends downwardly from the underside of the clamp ring 38 slightly inwardly of the inner terminus thereof at the location of each hood portion 305 on the clamp ring 38. The bearing flats 336 (only one shown) provide the entire contact between the upper surface of the substrate and the clamp ring 38, and they assure that a gap remains between the remainder of the clamp ring 38 and the substrate so as to minimize the formation of any film layer between the substrate 16 and the clamp ring 38.

Referring now to FIGS. 11 to 14, there is shown the sequential operation of the clamp ring 38 with respect to the shield 40, the pedestal 20, and the substrate 16. Referring first to FIG. 11, when the pedestal 20 is positioned below the suspended position of the clamp ring 38 on the upturned wall 41 of the shield 40, the trigger portion 306 of the rocker arm 300 is engaged on the upturned portion 41 of the shield 40. Because the rocker arm 300 is free to rotate about the pin 312, the mass of the clamp ring 38 will ensure that the clamp ring 38 is fully downwardly biased on the upturned wall 41 of the shield 40 and upper surface of the trigger portion 306 is thus pressed against the underside of the roof. This ensures that the engagement portion 304 is extended downwardly from the underside of the hood portion 305, such that the tip 324 and the lowermost extension of the protrusion 326 extend below the surface of the bearing flat 336 (Shown in FIG. 14).

Figure 12:
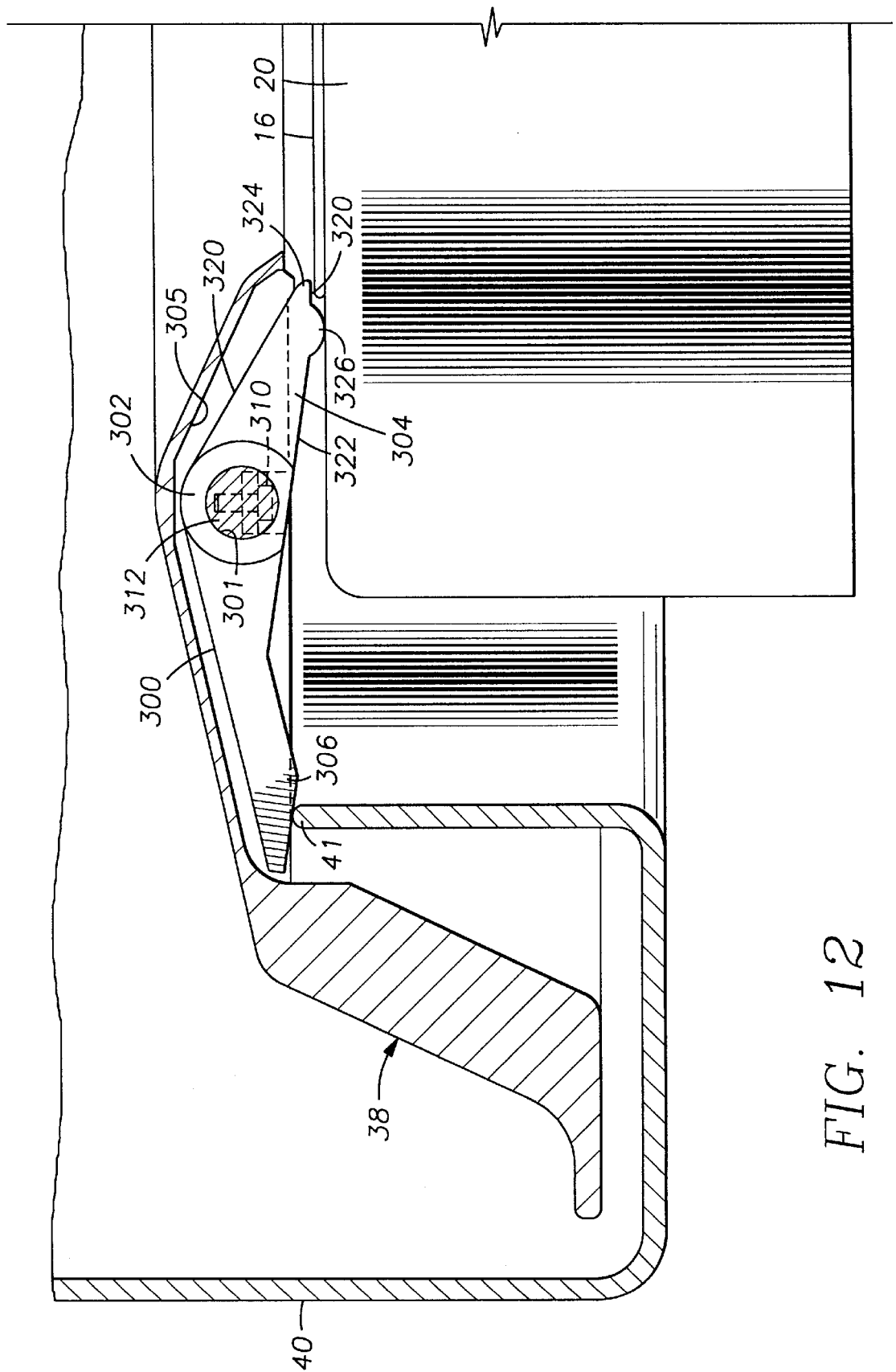
FIG. 12 is an additional partial sectional view of the clamp ring, substrate and substrate support of FIG. 11, wherein the substrate support member is in contact with the biasing member.

As the pedestal 20 moves upwardly in the chamber 10 from the position shown in FIG. 11 to the position shown in FIG. 12, the upper surface of the pedestal 20 extending radially outwardly from the edge of the substrate 16 will engage the lowermost extension of the protrusion 326, but the tip 324 of the rocker to arm 300 will not engage the substrate 16.

Figure 13:
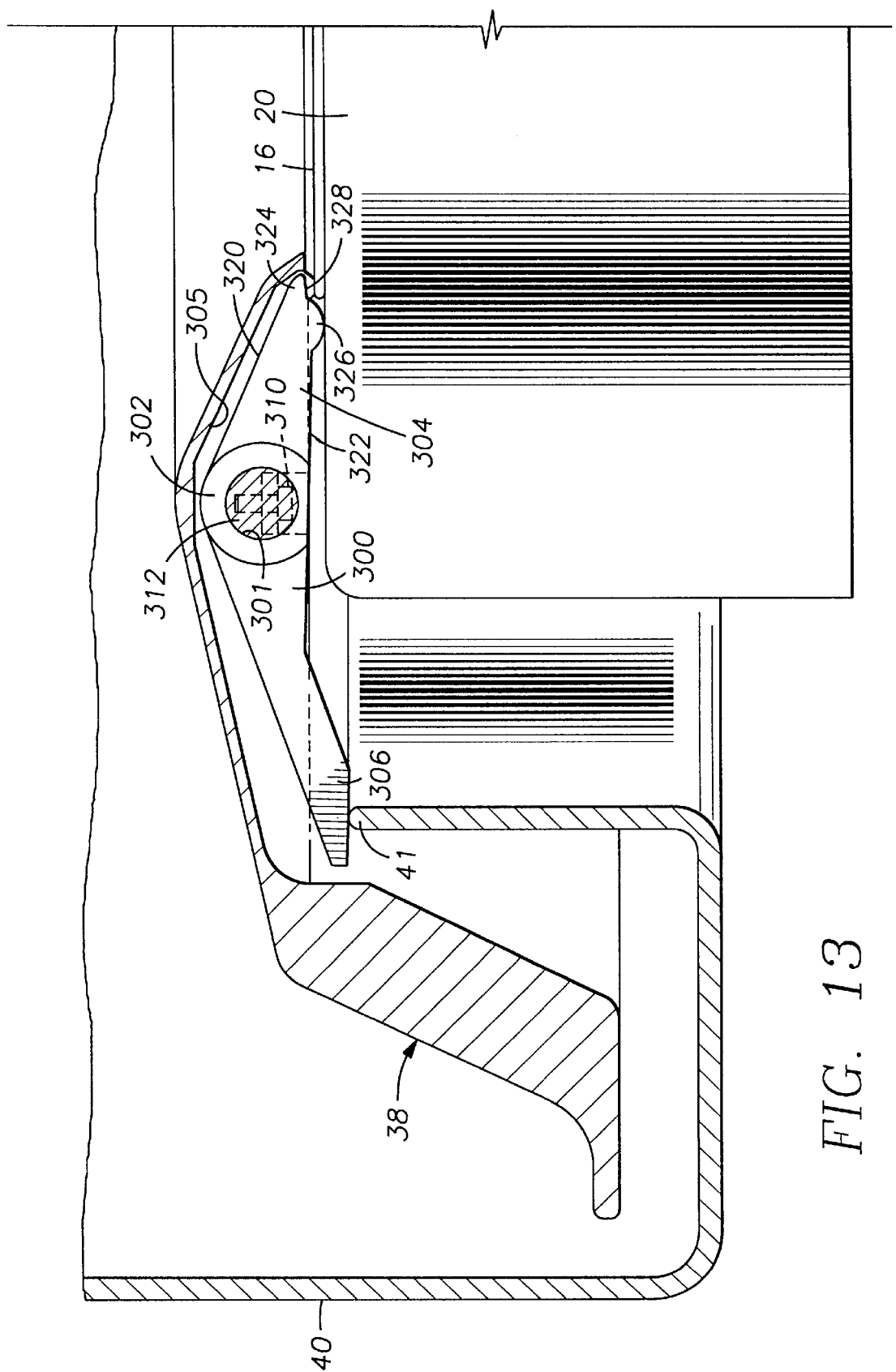
FIG. 13 is an additional partial sectional view of the clamp ring, substrate and substrate support of FIG. 11, wherein the biasing member is in contact with the substrate.

As the pedestal 20 moves further upwardly in the chamber 10, from the position shown in FIG. 12 to the position shown in FIG. 13, the pedestal 20 will push the engagement portion 304 of the rocker arm 300 inwardly of the hood portion 305. This will cause the trigger portion 306 to move outwardly of the hood portion 305. Because the downward movement of the trigger portion 306 is limited by the upturned wall 41 of the shield 40, as soon as the trigger portion engages the upturned wall 41 of the shield 40 the clamp ring 38 will begin moving upward from the shield 40.

As the pedestal 20 continues moving upwardly, it contacts the upper surface of the substrate with the bearing flat 336, thereby establishing direct contact between the pedestal 20 and the substrate through the pedestal 20. Once the pedestal 20 is in direct contact with the clamp ring 38, continued upward movement of the pedestal lifts the clamp ring 38, and the trigger portion 306, off the shield 40 as shown in FIG. 14. Because the mass of the rocker arm 300 on the trigger portion 306 side of the bore 301 exceeds the mass of the rocker arm 300 on the engagement portion 304 side of the bore 301, the rocker arm 300 will rotate about the pin 312 until the upper surface of the tip 324 engages the underside of the hood portion 305 as shown in FIG. 14. In this position, the protrusion 326 is lifted off the surface of the pedestal 20, and no contact exists between the substrate and the rocker arm 300.

After deposition is complete, the pedestal 20 will retract in the chamber 10 to reposition the clamp ring 38 on the shield 40 and then further retract to allow a robot blade to access the substrate. The retraction of the pedestal will first position the shield engaging portion 330 of the rocker arm 300 on the upturned wall 41 of the shield 40. Further retraction of the pedestal 20 will then cause the engagement portion 304 of the rocker arm 300 to move outwardly of the hood portion 305.

Referring again to FIG. 13, as the pedestal lowers from the position of the FIG. 14 to the position of FIG. 13, and the engagement portion 304 approaches the position of the substrate 16 and the pedestal 20, the lowermost extension of the protrusion 326 extends a distance from the substrate engaging portion 328 which is greater than the thickness of the substrate. Therefore, the protrusion will engage the pedestal 20 at a position outwardly of the edge of the substrate, and as the pedestal 20 continues to retract from the processing position of FIG. 13, the tip 324 of the rocker arm 300 will swing past the upper surface of the substrate without contacting the substrate.

In the instance where a film layer 32 has formed between the substrate 16 and the clamp ring 38, the rocker arm 300 will contact the substrate 16 and push the substrate 16 from the clamp ring 38. If a film layer forms between the substrate 16 and the inner terminus of the clamp ring 38, the substrate 16 may remain attached to the clamp ring 38 even as the clamp ring 38 becomes repositioned on the shield 40. In that event, the substrate engaging portion 328 of the rocker arm 300 will engage the upper surface of the substrate 16, and thus push the substrate from the clamp ring 38. Because the movement of the substrate engaging surface 328 of the rocker arm 300 is provided by the engagement of the trigger portion 306 with the shield 40, which is in turn provided by the continued retraction of the pedestal 20, the separation of the substrate 16 from the clamping ring 38 will occur in one continuous motion, with minimal separation of the substrate 16 from the upper surface of the pedestal 20. In the embodiment of the invention shown in FIGS. 11 to 15, the clamp ring 38 mass, in combination with the relative lengths of the trigger portion 306 and the engagement portion 304, provide a force at the substrate surface of approximately 0.3 N per rocker arm 300 when the substrate 16 must be pushed from the clamp ring 38.

The rocker arm 300 provides positive movement of the substrate 16 from the clamp ring 38 with predictable, repeatable, force levels, and only when necessary to separate the substrate 16 from the clamp ring 38. Additionally, because the mass of the clamp ring 38, and the relative lengths of the engagement portion 304 and trigger portion 306 are fixed, the force applied by the rocker arm 300 to push the substrate 16 from the clamp ring 38 remains the same throughout the duty life of the clamp ring 38. Finally, because the rocker arm 300 does not store energy in order to provide the force to push the substrate from the clamp ring 38, no hysterisis induced changes, or metal fatigue, will occur during the use of the clamp ring 38.

We claim:

1. An apparatus for shielding the edge of a semiconductor substrate from a deposition environment maintainable within a chamber, comprising:

a substrate support member;

a clamp ring positionable on said support member to shield the edge of a substrate received on said support member from the deposition environment maintainable in the chamber wherein the clamp ring has a lip overhanging the upper surface of the substrate when received on the support member; and a rocker arm positioned on a shaft on said clamp to ensure separation of the substrate from the shield member after the formation of a deposition layer on the substrate.

2. The apparatus of claim 1, wherein said rocker arm includes a central portion received over said shaft, an engagement portion extending from said central portion and terminating adjacent said lip, and a trigger portion extending from said central portion and selectively contactable with said hanger.

3. The apparatus of claim 2, wherein said engagement portion includes a protrusion engageable with said support member adjacent to the edge of a substrate received on said support member.

4. The apparatus of claim 3, further including a substrate engaging portion disposed adjacent to said protrusion.

5. The apparatus of claim 4, wherein said protrusion extends from said engagement portion by a distance which exceeds the thickness of a substrate positionable on said support member.

6. The apparatus of claim 2, wherein said clamp ring includes at least one hood portion.

7. The apparatus of claim 6, wherein said clamp ring includes at least one spacer extending therefrom and terminating in a substrate engaging face; and said substrate engaging face contacts the surface of a substrate when said clamp ring is positioned on said support member.

8. The apparatus of claim 7, wherein said engagement portion is positionable in a first position wherein the engagement portion is extended from the clamp ring, a second position wherein said engagement portion is located parallel to said substrate engaging face, and a third position wherein said engagement portion is received in said hood.

9. The apparatus of claim 8, wherein said trigger portion is positionable, with respect to said clamp ring, to move said engagement portion between said first, second and third positions.

10. The apparatus of claim 8, wherein said engagement portion is engageable with the upper surface of the substrate as the extending portion moves from said third position to said first position where the substrate becomes adhered to said clamp ring.

11. An apparatus for shielding the edge of a substrate from film layer forming deposition materials in a processing chamber, comprising:

a shield ring having a lip;

a hanger positioned in the chamber and support said shield ring thereon;

a substrate support member positionable at the retracted position in the chamber for receipt of a substrate thereon, an intermediate position for the engagement of the substrate against the shield ring suspended in said hanger, and an extended position wherein the substrate is moved through the shield ring and lifts said shield ring from said hanger;

a spring arm extending adjacent said lip, said spring arm including a spring mounting portion extending from said spring arm and mounted to said shield ring and a free end engageable on the substrate as the substrate support member moves between said retracted and said intermediate position;

a fulcrum intermediate of said free end and said mounting portion; and said free end positioned between the substrate and the lip as said shield ring is lifted off said holder.

12. An apparatus for shielding the edge of a substrate, comprising:

a) a base adapted to be received on the exposed surface of a substrate;

b) a roof extending outwardly of said base, said roof including a fulcrum extending therefrom;

c) a lip extending inwardly of said base and overhanging an annular region adjacent to the perimeter of the substrate; and d) a biasing member extendable between the substrate and the roof to cause separation of the substrate from the base in the event that a film layer forms between the base and the substrate, said biasing member including an attachment portion attached to said roof, an engagement portion for engagement against the upper surface of the substrate when said base is received on the substrate, and a spring arm portion extending between said attachment portion and said engagement portion.

13. An apparatus for shielding the edge of a semiconductor substrate from a deposition environment maintainable within a chamber, comprising:

a substrate support member;

a shield member positionable on said support member having a lip overhanging the upper surface of the substrate to shield the edge of a substrate received on said support member from the deposition environment maintainable in the chamber and a fulcrum extending from the lower surface of the shield member; and a biasing member to ensure separation of the substrate from the shield member after the formation of a deposition layer on the substrate.

14. The apparatus of claim 13, wherein said biasing member is engageable with said fulcrum as said biasing member engages the substrate to energize said biasing member to provide a force to separate the substrate from said shield member when said substrate is moved away from said shield member.

* * * * *